US012804805B2

(12) United States Patent
Steinau et al.

(10) Patent No.: US 12,804,805 B2
(45) Date of Patent: Nov. 17, 2026

(54) PRINTED CIRCUIT BOARD, TRANSMISSION CONTROLLER WITH A PRINTED CIRCUIT BOARD, AND METHOD FOR PRODUCING A PRINTED CIRCUIT BOARD

(71) Applicant: Vitesco Technologies Germany GmbH, Hannover (DE)

(72) Inventors: Martin Steinau, Nuremberg (DE); Johannes Bock, Kirchensittenbach (DE); Dimitrios Kanlis, Nuremberg (DE); Corneliu Armeanu, Nuremberg (DE); Nikolaos Mallios, Nuremberg (DE)

(73) Assignee: Vitesco Technologies Germany GmbH, Hannover (DE)

( * ) Notice: Subject to any disclaimer, the term of this patent is extended or adjusted under 35 U.S.C. 154(b) by 210 days.

(21) Appl. No.: 18/145,237

(22) Filed: Dec. 22, 2022

(65) Prior Publication Data

US 2023/0122633 A1 Apr. 20, 2023

Related U.S. Application Data

(63) Continuation of application No. PCT/EP2021/066843, filed on Jun. 21, 2021.

(30) Foreign Application Priority Data

Jul. 2, 2020 (DE) ..................... 10 2020 208 268.5

(51) Int. Cl.
*H05K 1/02* (2006.01)
*H05K 3/28* (2006.01)
*H05K 3/06* (2006.01)

(52) U.S. Cl.
CPC ........... *H05K 1/0296* (2013.01); *H05K 3/282* (2013.01); *H05K 3/284* (2013.01); *H05K 3/06* (2013.01);
(Continued)

(58) Field of Classification Search
CPC ...... H05K 1/02; H05K 1/0218; H05K 1/0296; H05K 1/18; H05K 3/06; H05K 3/282;
(Continued)

(56) References Cited

U.S. PATENT DOCUMENTS 5,744,084 A 4/1998 Chia
6,218,730 B1 * 4/2001 Toy ......................... H01L 23/42
257/713
(Continued)

FOREIGN PATENT DOCUMENTS

CN 102960082 A 3/2013
CN 107535060 A 1/2018
(Continued)

OTHER PUBLICATIONS

International Search Report and Written Opinion dated Oct. 5, 2021 from corresponding International Patent Application No. PCT/EP2021/066843.
(Continued)

*Primary Examiner* — Binh B Tran

(57) ABSTRACT

The disclosure relates to a printed circuit board with a printed circuit board core which has an upper face. A metallization layer is formed on at least some sections of the upper face. The metallization layer includes at least one first region and a second region which differs from the first region. An electric module is arranged on the first region and is connected to same in an electrically conductive manner, the second region is arranged and/or formed at a distance to the first region, and the second region surrounds and/or
(Continued)

borders the first region. The electric module is encapsulated with a sealing material, where the encapsulation is delimited by the second region.

9 Claims, 4 Drawing Sheets

(52) U.S. Cl.
CPC .............. *H05K 2201/09781* (2013.01); *H05K 2201/10151* (2013.01); *H05K 2201/10166* (2013.01); *H05K 2203/1316* (2013.01)

(58) Field of Classification Search
CPC ................. H05K 3/284; H05K 3/4007; H05K 2201/09781; H05K 2201/10151; H05K 2201/10166; H05K 2203/1316; H01L 21/56; H01L 21/78; H01L 21/561; H01L 21/565; H01L 21/4853; H01L 21/6835; H01L 21/32051; H01L 23/10; H01L 23/24; H01L 23/29; H01L 23/42; H01L 23/66; H01L 23/295; H01L 23/552; H01L 23/645; H01L 23/3107; H01L 23/3128; H01L 23/3135; H01L 23/49805; H01L 23/49811; H01L 23/49822; H01L 23/49838; H01L 24/17; H01L 24/49; H01L 24/50; H01L 24/86; H01L 24/97; H01L 25/0655; H01L 25/0657; H01L 25/16; H01L 25/50
USPC ........ 361/760, 709, 762, 764, 765; 174/261; 438/127, 381; 257/200, 531, 659, 701, 257/704, 707, 710, 713, 728, 737, 738, 257/778
See application file for complete search history.

(56) References Cited

U.S. PATENT DOCUMENTS 6,353,420 B1 * 3/2002 Chung ............. G06K 19/07747 235/441
6,362,525 B1 * 3/2002 Rahim .................... H01L 24/17 361/764
6,421,013 B1 * 7/2002 Chung .................... H01L 21/56 235/441
8,637,963 B2 * 1/2014 Upadhyayula ........ H01L 23/552 257/676
9,793,222 B1 * 10/2017 Lee ................... H01L 23/49838
2002/0118522 A1 * 8/2002 Ho .................... H01L 23/49827 257/E23.07
2003/0062541 A1 * 4/2003 Warner ................... H01L 24/50 257/E23.092
2003/0111738 A1 * 6/2003 Buschbom ........ H01L 23/49838 257/E23.079
2011/0210903 A1 * 9/2011 Sarabandi .......... H01Q 15/0086 343/904
2012/0241938 A1 * 9/2012 Chen .................... H10N 30/883 257/704
2013/0087895 A1 * 4/2013 Upadhyayula ........ H01L 23/552 257/659
2013/0215582 A1 8/2013 Dittrich
2014/0231973 A1 * 8/2014 Huang .................. H01L 23/295 257/659
2015/0342060 A1 11/2015 Kim
2016/0095217 A1 * 3/2016 Kurauchi ............... H05K 3/242 174/261
2017/0041692 A1 * 2/2017 Watson .................. H04R 19/04
2017/0110383 A1 * 4/2017 Huang ................ H01L 23/3135
2017/0272051 A1 * 9/2017 Kurihara .............. H03H 9/6483
2017/0294895 A1 * 10/2017 Kakita .............. H01L 23/53242
2017/0331455 A1 * 11/2017 Kuroyanagi ........ H01L 23/5226
2018/0124956 A1 5/2018 Liskow
2018/0159504 A1 * 6/2018 Oda ..................... H03H 9/1064
2018/0177058 A1 6/2018 Liskow
2019/0267301 A1 * 8/2019 Yazaki ................. H05K 9/0075

FOREIGN PATENT DOCUMENTS

| | | | |
|---|---|---|---|
| DE | 102015214311 | A1 | 2/2017 |
| DE | 102018204356 | A1 | 10/2018 |
| JP | 863310140 | A | 12/1988 |
| JP | H09219470 | A | 8/1997 |
| JP | H1032373 | A | 2/1998 |
| WO | 2014185109 | A1 | 11/2014 |

OTHER PUBLICATIONS

German Office Action dated Nov. 30, 2021 for corresponding German Patent Application No. 10 2020 208 268.5.
Chinese Office Action dated Jul. 24, 2025 for corresponding Patent Application No. 202180047115.4.

* cited by examiner

PRINTED CIRCUIT BOARD, TRANSMISSION CONTROLLER WITH A PRINTED CIRCUIT BOARD, AND METHOD FOR PRODUCING A PRINTED CIRCUIT BOARD

CROSS-REFERENCE TO RELATED APPLICATIONS

This application claims the benefit of International Application PCT/EP2021/066843, filed Jun. 21, 2021, which claims priority to German Application 10 2020 208 268.5, filed Jul. 2, 2020. The disclosures of the above applications are incorporated herein by reference.

TECHNICAL FIELD

The disclosure relates to a printed circuit board, such as a transmission controller, a power electronics and/or for a controller of an actuator of an electric motor, with an electric module arranged on the printed circuit board and protected against aggressive media. An encapsulation of the electric module is led as far as a metallization layer arranged and/or formed on an upper face of the printed circuit board. In addition, the disclosure relates to a transmission controller having the printed circuit board. Furthermore, the disclosure relates to a method for producing a printed circuit board.

BACKGROUND

Printed circuit boards with electric modules, where the printed circuit board is at least partially encapsulated with a plastics material to protect the electric modules from aggressive media, are known in principle. A printed circuit board of this type is shown, for example, in U.S. Pat. No. 5,744,084A. For encapsulation of the electric module arranged on the printed circuit board, a circumferential dam structure is arranged at a distance from the electric module on the upper face of the printed circuit board. Accordingly, the dam structure is built up on the upper face of the printed circuit board and serves to ensure that a circumferential and protruding edge of an encapsulation or molding tool is seated on the dam structure in order to achieve a seal for the encapsulation process for encapsulation the electric module. Forming a dam structure built additionally onto the printed circuit board requires another process step and additional material, which can increase the cost of the printed circuit board. In addition, depending on the design, the protruding edge of the encapsulation tool may damage the printed circuit board when the encapsulation tool is driven onto the printed circuit board. Likewise, due to the protruding edge, there may be increased wear of the encapsulation or overmolding tool in the region of the edge, so that the encapsulation tool may exhibit increased wear and must be replaced at an early stage.

SUMMARY

Proceeding from the known prior art, the present disclosure provides a printed circuit board that has increased protection against corrosive media and that can be produced cost-effectively. In addition, the disclosure provides a method for producing a printed circuit board, with which a printed circuit board can be produced cost-effectively and in a manner that is material-friendly.

One aspect of the disclosure provides a printed circuit board with a printed circuit board core which has an upper face, a metallization layer being formed on at least some sections of the upper face. The metallization layer includes at least one first region and a second region which differs from the first region. An electric module is arranged on the first region and is connected to same in an electrically conductive manner. The second region is arranged and/or formed at a distance to the first region, and the second region surrounds and/or borders the first region. The electric module is encapsulated with a sealing material, where the encapsulation is delimited by the second region.

In other words, it is an aspect of the disclosure to provide a printed circuit board. The printed circuit board may be used in a transmission controller, a power electronics for a fully or at least partially electrically driven motor vehicle and/or in a controller of an actuator for an electric machine, such as a brushless DC motor (BLDC). The printed circuit board has a printed circuit board core. The printed circuit board core may also be referred to as a so-called "prepreg". The term "prepreg" refers to pre-impregnated fibers, such as a glass fabric, which are saturated with resin. In some examples, the substrate material of the printed circuit board core is an FR4 prepreg. The resin content in the printed circuit board core can be standard resin (SR), medium resin (MR), or high resin (HR), depending on the design and application.

In some implementations, the printed circuit board core has an upper face, where a metallization layer is formed on the upper face at least in some portions. The upper face may be arranged in a direction parallel to the plane of the printed circuit board core. The metallization layer is electrically conductive. In some examples, the metallization layer is formed of aluminum, copper and/or silver or includes at least partially aluminum, copper and/or silver.

In some examples, the metallization layer has at least a first region and a second region different from the first region. The first region and the second region are galvanically isolated from each other on the upper face of the printed circuit board. An electric module is arranged on the first region and is electrically conductively connected thereto. The electrical connection to the first region of the metallization layer and the electric module can be, for example, an integrally bonded connection, such as an adhesive connection, a bonded connection, a sintered connection and/or a soldered connection. The electric module may be a semiconductor, a chip, a MOSFET (metal oxide semiconductor field effect transistor), an IGBT (insulated gate bipolar transistor), an ASIC (application-specific integrated circuit) and/or a sensor, such as a sensor dome.

The second region is spaced apart from and/or formed around the first region, where the second region surrounds and/or borders the first region. It is further conceivable that the plurality of first regions is formed on the upper face of the printed circuit board core, and the plurality of first regions is bordered by the second region.

The electric module arranged on the first region is encapsulated and/or potted with a sealing material. This process is also referred to as "overmolding" or "transfer molding". It is provided here that the encapsulation is limited by the second region of the metallization layer. In other words, the second metallization layer on the upper face of the printed circuit board core acts as a barrier or boundary for the overmolding process and provides a seal for the injection molding process or overmolding process with the injection molding or overmolding tool. Accordingly, the printed circuit board has a barrier formed on the upper face in the form of a metallization layer, which is generally arranged on the upper face of the printed circuit board core anyway. Accordingly, no additional structure in the form of a dam structure built onto the upper face of the printed circuit board is required to provide a seal for encapsulating the electric module. Thus, due to the second region of the metallization layer formed on the upper face of the printed circuit board core and surrounding the first region at a distance therefrom, a sealing structure for the overmolding process can be provided. The costs of the printed circuit board can be reduced, since only the metallization layer arranged on the upper face of the printed circuit board core is structured in such a way that it forms a sealing contour. By way of the encapsulation, a printed circuit board protected against external, corrosive media, such as oil and/or water, can be provided which can be produced inexpensively.

The material used to encapsulate the electric module, the sealing material, is usually a plastic. The sealing material may also be referred to as potting material. For example, the sealing material can be a thermoplastic. In other examples, the sealing material is a thermoset, such as an epoxy-based thermoset. Such thermosets exhibit increased temperature resistance and increased resistance to external effects or influences. This means that the electric module can be permanently protected from external media, such as oil and/or water.

In some implementations, a material thickness of the first region of the metallization layer in a direction perpendicular to the plane of the printed circuit board core corresponds to a material thickness of the second region of the metallization layer in the direction perpendicular to the plane of the printed circuit board core. In other words, the first region and the second region have an equal material thickness. The first region and the second region may be formed by the metallization layer formed on the upper face of the printed circuit board core by a material-removing process, for example, a chemical removal process such as an etching process. Thus, the first region and the second region can be produced in a simple, cost-effective manner and can have the same material thickness.

In some implementations, it can be provided that a solder resist coating is arranged on the upper face of the printed circuit board, where the solder resist coating is led as far as an outer border of the second region, the outer border is formed on a side of the second region facing away from the first region, and a material thickness of the solder resist coating in a direction perpendicular to the plane of the printed circuit board is greater than the material thickness of the second region. In other words, the thickness of the solder resist coating is greater than the thickness or material thickness of the second region. In this way, with respect to the cross-section of the printed circuit board, a step is formed in the region between the solder resist coating and the second region of the metallization layer. This step, when the encapsulation tool or overmolding tool is seated on and seals with the second region, can act as an additional barrier to prevent possible leakage of a potting material during the molding process.

The solder resist coating has electrically insulating properties. In some examples, the solder resist coating is formed from an epoxy resin. The solder resist coating may have at least partially yielding and/or elastic properties.

In some implementations, the solder resist coating is led as far as an inner border of the second region facing the first region, and the solder resist coating covers the second region. Thus, when the encapsulation tool moves onto and seals against the second region, a slight deformation of the solder resist coating may occur between the metallization layer and the encapsulation tool, such that an increased seal between the metallization layer and the encapsulation tool can be enabled. Thus, an increased seal can be achieved during the overmolding process.

In principle, no solder resist coating is arranged on the first regions of the metallization layer. They are therefore free of solder resist coating.

In some examples, only a second region is provided, which surrounds the first region and is formed at a distance from the first region. It is conceivable that the second region is spiral-shaped and/or helical.

In some implementations, the second region includes a plurality of spaced-apart second regions which are galvanically isolated from each other and are each formed circumferentially. The plurality of juxtaposed second regions can increase the deformability of the second metallization layer when the encapsulation tool is driven onto the printed circuit board, and can also increase a distance between the encapsulation tool and the printed circuit board in the seating region because they have a reduced cross-sectional area. The plurality of separate second regions can extend the path for escaping material, which can increase the sealing effect between the printed circuit board and the overmolding tool.

In some examples, only a first region and a second region are formed on the upper face of the printed circuit board, where the electric module arranged on the upper face is encapsulated or overmolded.

In some examples, the printed circuit board core has a lower face which is arranged at a distance from the upper face and, correspondingly to the upper face, has a metallization layer with a first region and a second region, where an electric module is arranged on the first region, and the electric module is encapsulated with a sealing material, where the encapsulation is bounded by the second region, which is arranged on the lower face. In this way, a printed circuit board is provided which is encapsulated and/or overmolded from both sides at least in some sections.

The printed circuit board core can basically be of single-layer design, where the metallization layer is formed on the upper face and/or the lower face.

In some implementations, the printed circuit board core is multi-layered. Accordingly, the multi-layer printed circuit board core has an upper face and a lower face spaced apart from the upper face, where conductor tracks and/or structured metallization layers spaced apart from one another are arranged in the multi-layer printed circuit board core. The conductor tracks and/or structured metallization layers arranged within the printed circuit board core can be electrically conductively connected to one another by means of vias and/or through-platings. Likewise, the first regions can be electrically conductively connected to the metallization layers arranged within the printed circuit board. The second regions, on the other hand, are not electrically conductively connected to the conductor tracks arranged within the printed circuit board.

Another aspect of the disclosure provides a transmission controller for a motor vehicle, where the transmission controller includes the printed circuit board according to the first aspect of the disclosure.

Yet another aspect of the disclosure provides a method for producing the printed circuit board according to the first aspect of the disclosure. The method including providing a printed circuit board core. The printed circuit board core has an upper face and a metallization layer is arranged on the upper face. The method also includes structuring the metallization layer so that a first region and a second region of the metallization layer, which is different from the first region and galvanically isolated therefrom, are formed on the upper face, and the first region surrounds and/or borders the second region. The method also includes arranging and electrically contacting an electric module on the first region, and arranging the printed circuit board core into an overmolding tool and closing the overmolding tool. The overmolding tool seals with the second region. The method also includes encapsulating and/or overmolding the electric module with a sealing material and opening the overmolding tool and removing the printed circuit board from the overmolding tool.

The overmolding tool may have a return and/or a recess or depression on a side facing the printed circuit board in order to form a cavity in the region of the electronic module arranged on the printed circuit board when the tool is driven onto the printed circuit board core, so that this cavity can be potted with the sealing material. In some examples, the injection molding tool is formed without protrusions circumferentially around the depression. Accordingly, the overmolding tool does not have a protrusion contour that cuts into and/or sits on the printed circuit board when the tool is driven onto the printed circuit board to achieve the seal with the printed circuit board. Such a protrusion has the disadvantage that it can damage the printed circuit board or, for example, the electrical conductor tracks arranged therein. Thus, a material-friendly and cost-effective method for producing the printed circuit board is provided.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
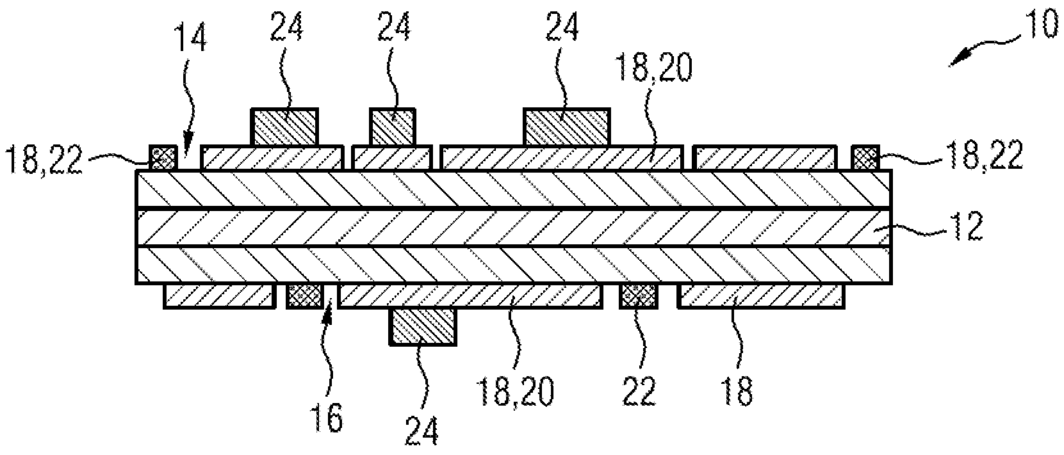
FIG. 1 shows a cross-section through an exemplary printed circuit board.

FIG. 1 shows a cross-section through a printed circuit board 10, for example, for a transmission controller of a motor vehicle. The printed circuit board 10 has a multi-layer circuit board core 12 with an upper face 14 and a lower face 16 arranged at a distance from the upper face 14. Both the upper face 14 and the lower face 16 are oriented and/or formed in a direction parallel to the plane of the printed circuit board core 12. Between the upper face 14 and the lower face 16, the printed circuit board core 12 has a plurality of spaced-apart conductive tracks (not shown) that may be electrically conductively connected to each other by way of vias and/or through-platings. Usually, the printed circuit board core 12 is formed from a prepreg.

On the upper face 14 and on the lower face 16, the printed circuit board core 12 has, at least in some sections, a metallization layer 18 which is electrically conductive. The metallization layer 18 may include and/or be formed from aluminum, copper and/or silver, at least in part. In this example, the metallization layer 18 is formed from copper.

The metallization layer 18 has a first region 20 and a second region 22 different from the first region 20. The first region 20 and the second region 22 of the upper face 14 and lower face 16 are galvanically isolated from each other. In other words, the first region 20 and the second region 22 are arranged electrically non-conductively with respect to each other on the respective upper face 14 or lower face 16. An electric module 24 is arranged on the first region 20 and is electrically conductively connected thereto. The electrical connection to the first region 20 of the metallization layer 18 and the electric module 24 can be, for example, an integrally bonded connection, such as an adhesive connection, a bonded connection, a sintered connection and/or a soldered connection. The electric module 24 may be a MOSFET, an IGBT, an ASIC and/or a sensor, such as a sensor dome.

The second region 22 is arranged and/or formed in a spaced manner relative to the first region 20, where the second region 22 surrounds and/or borders the first region 20. Presently, a plurality of first regions 20 are arranged on the upper face 14, which is surrounded by the second region 22.

Further, it is apparent that a material thickness of the first region 20 of the metallization layer 18 in a direction perpendicular to the plane of the printed circuit board core 12 corresponds to a material thickness of the second region 22 of the metallization layer 18 in the direction perpendicular to the plane of the printed circuit board core 12. In other words, the first region 20 and the second region 22 have an equal material thickness. The first region 20 and the second region 22 are preferably formed by the metallization layers 18 formed on the upper face 14 and the lower face 16 of the printed circuit board core 12 by a material-removing process, such as a chemical removal process such as an etching process. Thus, the first region 20 and the second region 22 can be cost-effectively fabricated in a simple manner and have the same material thickness.

Figure 2:
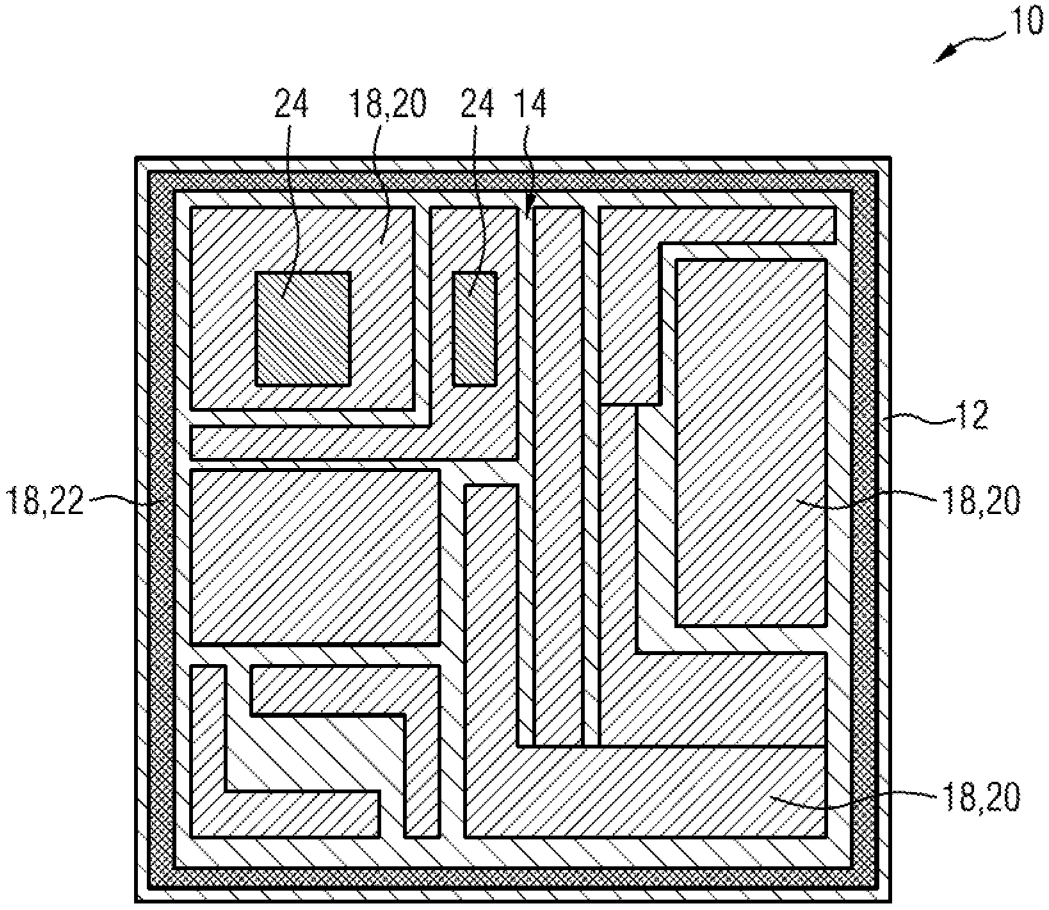
FIG. 2 shows a plan view of the exemplary printed circuit board.

FIG. 2 shows a plan view of the printed circuit board 10. The circuit board core 12 has the plurality of first regions 20 surrounded by the second region 22 on the upper face 14. Accordingly, the second region 22 is formed circumferentially.

Figure 3:
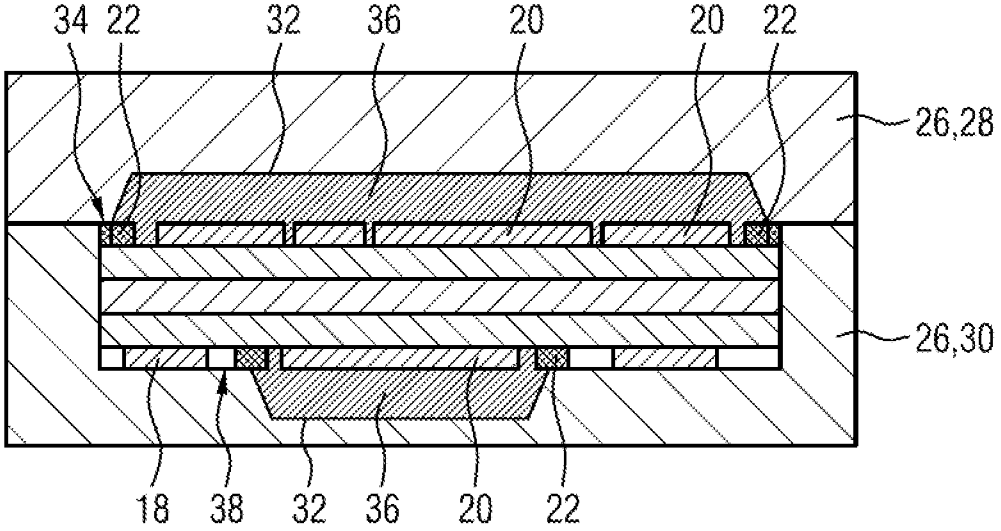
FIG. 3 shows a cross-section through an overmolding tool with the printed circuit arranged therein.

FIG. 3 shows a cross-section through an overmolding tool 26 with the printed circuit board 10 arranged therein. The overmolding tool 26 can also be referred to as an encapsulation tool. It has at least one upper tool half 28 and a lower tool half 30. The printed circuit board 10 is arranged between the two tool halves 28, 30. For encapsulation of the printed circuit board 10, the tool halves 28, 30 have corresponding recesses 32 and/or returns on a side facing the printed circuit board 10.

The upper tool half 28 sits on the lower tool half 30 and on the upper face 14 of the printed circuit board core 12. In this regard, a first surface 34 surrounding the recess 32 of the upper tool half 28 seals with the second region 22 of the metallization layer 18. The cavity formed between the upper face 14 and the recess 32 of the upper tool half 28 is potted and/or overmolded with a sealing material 36, for example a plastic, such as an epoxy-based thermoset.

Correspondingly to the upper face 14, the lower tool half 30 sits on the upper tool half 28 and on the lower face 16 of the printed circuit board core 12, where a second surface 38 surrounding the recess 32 of the lower tool half 30 seals against the second region 22 of the lower face 16. The cavity formed between the lower face 16 and the recess 32 is potted or overmolded with the sealing material 36.

The first surface 34 of the upper tool half 28 surrounding the recess 32 and the second surface 38 of the lower tool half 30 are formed without protrusions. In other words, the upper tool half 28 and the lower tool half 30 do not have any protrusion on their side facing the printed circuit board 10 for sealing with the printed circuit board 10 for an encapsulation process and/or overmolding process. In this way, an encapsulation of the printed circuit board 10 that is material-friendly can be made possible. Likewise, damage to the printed circuit board 10 as a result of the encapsulation and/or overmolding process can be reduced.

Figure 4:
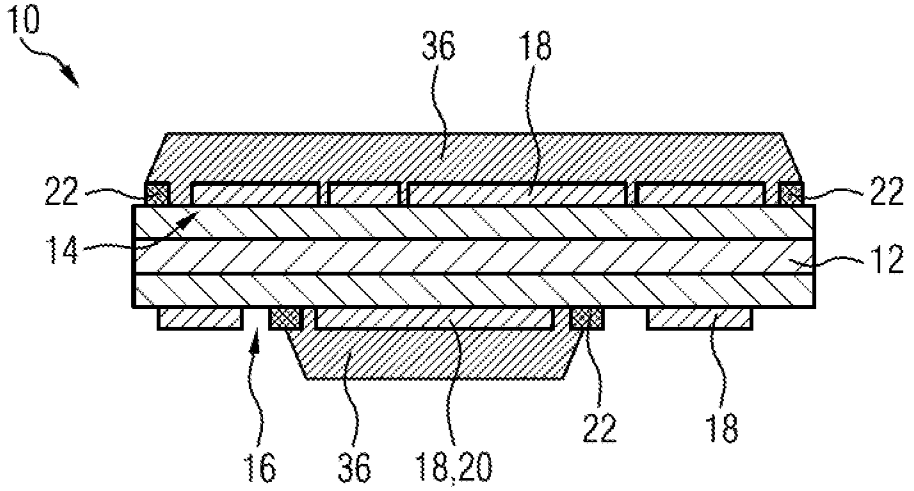
FIG. 4 shows a cross-section through the exemplary printed circuit board with an encapsulation in at least some sections.

FIG. 4 shows a cross-section through the printed circuit board 10 shown in FIG. 3 after the printed circuit board 10 has been at least partially encapsulated. The sealing material 36 is led as far as and/or is delimited by the second region 22, since the overmolding tool 26 shown in FIG. 3 seals against the second region 22. Accordingly, the printed circuit board 10 has a barrier formed on the upper face 14 and on the lower face 16 in the form of a metallization layer 18, which is generally arranged on both the upper face 14 and the lower face 16 of the printed circuit board core 12 anyway. Accordingly, no additional structure in the form of a dam structure built onto the upper face 14 or lower face 16 of the printed circuit board 10 is required to provide a seal for encapsulating the electric modules 24. Thus, by having the second region 22 of the metallization layer 18 formed on the upper face 14 or lower face 16 of the printed circuit board core 12 and surrounding the first region 20 in a spaced-apart manner, a sealing structure for the overmolding process can be provided cost-effectively. The costs of the printed circuit board 10 can thus be reduced, since only the metallization layer 18 arranged on the upper face 14 and lower face 16 of the printed circuit board core 12 is structured in such a way that it forms a sealing contour. By at least partially encapsulating the printed circuit board 10, a printed circuit board 10 protected against external, corrosive media, such as oil and/or water, can be provided.

Figure 5:
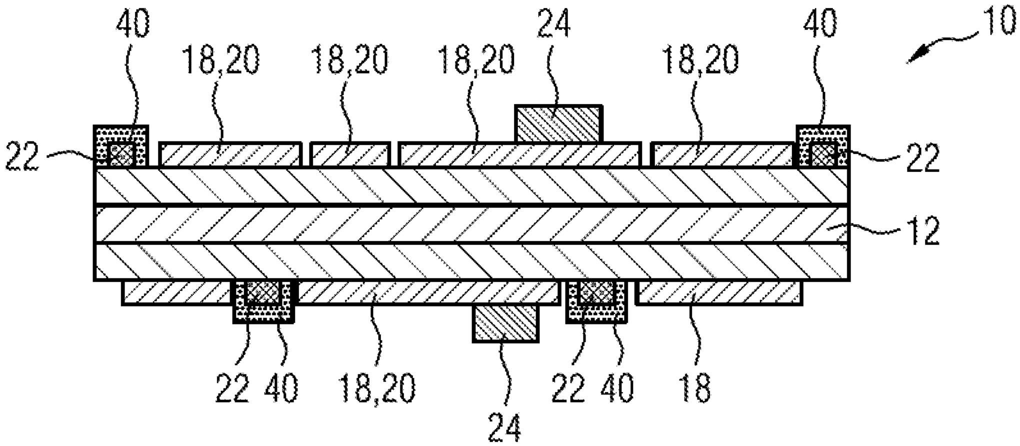
FIG. 5 shows a cross section through an exemplary printed circuit board.

FIG. 5 shows a cross-section through the printed circuit board 10 in another example. In contrast to the first example, in the second example a solder resist coating 40 or a solder resist layer formed of an electrically insulating material is arranged on the second region 22. In other words, the solder resist coating 40 is led as far as and surrounds an inner border of the second region 22. The inner border faces the first region 20. The second region 22 is covered by the solder resist coating 40. The solder resist coating 40 has an at least partially yielding and/or elastic property. Thus, as the encapsulation tool and/or overmolding tool 26 drives onto and seals against the second region 22, a slight deformation of the solder resist coating 40 may occur between the metallization layer 18 and the overmolding tool 26, such that an increased seal may be enabled between the metallization layer 18 of the second region 22 and the overmolding tool 26. Thus, an increased seal can be achieved during the overmolding process.

Figure 6:
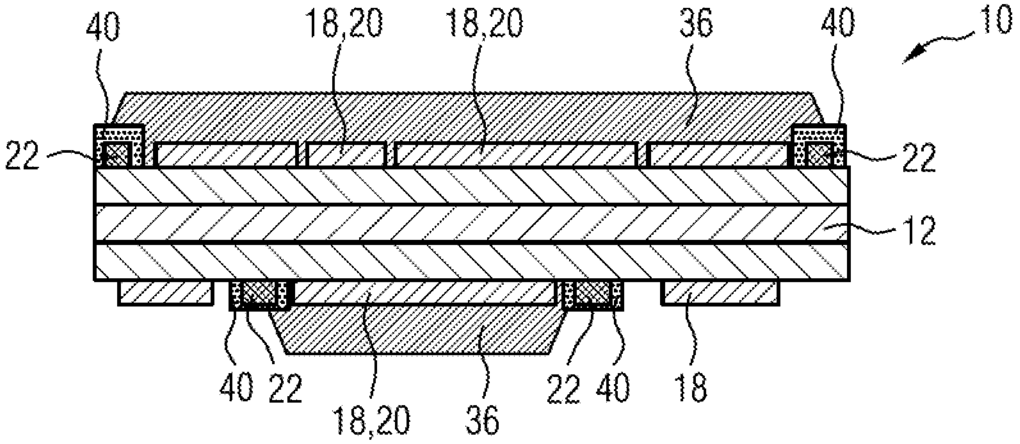
FIG. 6 shows a cross-section through the exemplary printed circuit board with an encapsulation in at least some sections.

FIG. 6 shows a cross-section through the printed circuit board 10 shown in FIG. 5 after the printed circuit board 10 has been at least partially overmolded. The sealing material 36 is led as far as and/or is delimited by the solder resist coating 40 arranged on the second region 22.

Figure 7:
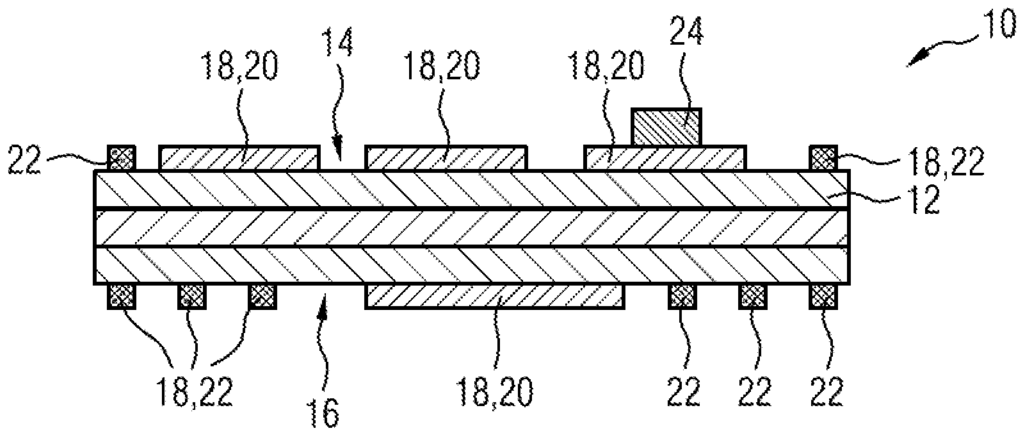
FIG. 7 shows a cross section through an exemplary printed circuit board.

FIG. 7 shows a cross-section through the printed circuit board 10 in a third example. Here, it is provided that the second region 22 of the upper face 14 is formed differently from the second region 22 of the lower face 16. The second region 22 of the lower face 16 has a plurality of spaced-apart second regions 22, which are galvanically isolated from each other and are formed circumferentially. The plurality of adjacently arranged second regions 22 can increase the deformability of the metallization layer 18 when the encapsulation tool or overmolding tool 26 is driven onto the printed circuit board 10, and may also increase a path between the overmolding tool 26 and the printed circuit board 10 in the mounting region to further extend the path for escaping material. The sealing effect of the printed circuit board 10 to the overmolding tool 26 can thus be increased.

Figure 8:
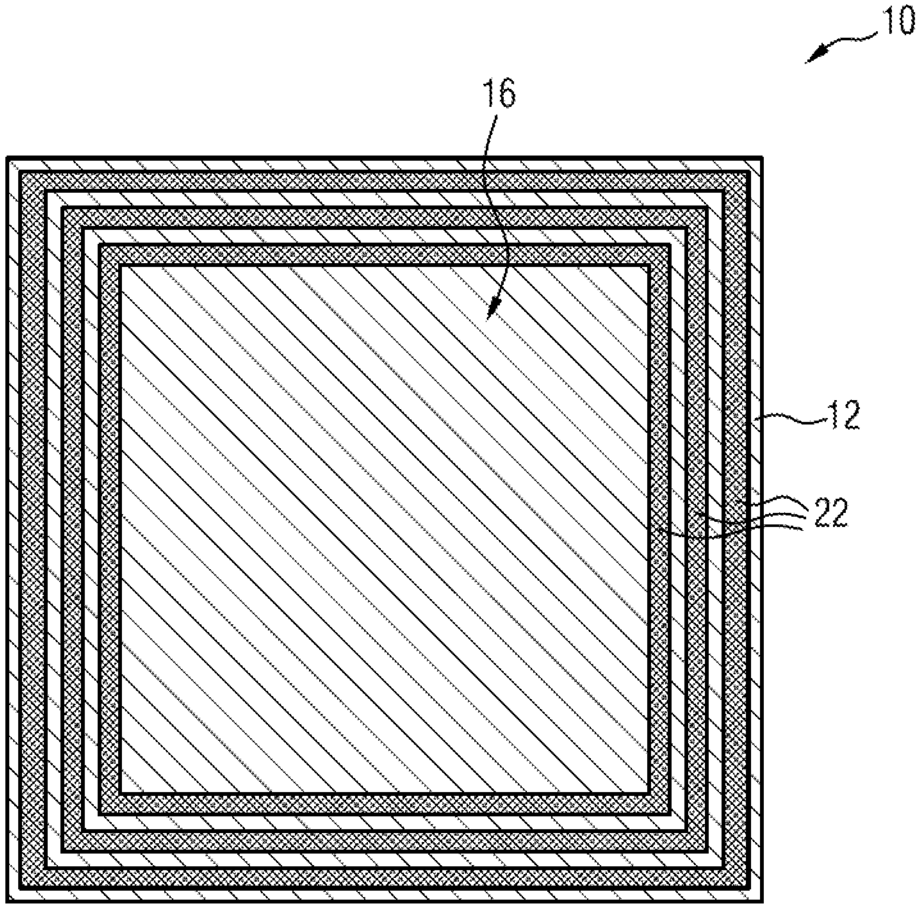
FIG. 8 shows a plan view of the exemplary printed circuit board.

FIG. 8 shows a plan view of the lower face 16 of the printed circuit board 10 with the second regions 22 arranged adjacently and formed circumferentially. The first regions 20 are not shown in the plan view.

A number of implementations have been described. Nevertheless, it will be understood that various modifications may be made without departing from the spirit and scope of the disclosure. Accordingly, other implementations are within the scope of the following claims.

What is claimed is:

1. A printed circuit board comprising:

a printed circuit board core having an upper face;

a metallization layer being formed on at least some sections of the upper face, the metallization layer comprising:

at least one first region, and a second region which differs from the first region, the second region is arranged and/or formed at a distance to the first region, and the second region surrounds and/or borders the first region;

an electric module arranged on the first region and is connected to same in an electrically conductive manner, the electric module is encapsulated with a sealing material, the encapsulation is delimited by the second region;

a solder resist coating covering the second region; and a sealing material and/or sealant at least partially overmolding as far and/or is delimited by the solder resist coating.

2. The printed circuit board of claim 1, wherein a material thickness of the first region of the metallization layer in a direction perpendicular to a plane of the printed circuit board core corresponds to a material thickness of the second region of the metallization layer in the direction perpendicular to the plane of the printed circuit board core.

3. The printed circuit board of claim 1, wherein:

the solder resist coating is led as far as an outer border of the second region, the outer border is formed on a side of the second region facing away from the first region, and wherein a material thickness of the solder resist coating in a direction perpendicular to the plane of the printed circuit board core is greater than the material thickness of the second region.

4. The printed circuit board of claim 3, wherein the solder resist coating is led as far as an inner border of the second region facing the first region.

5. The printed circuit board of claim 1, wherein the second region is spiral-shaped and/or helical.

6. The printed circuit board of claim 1, wherein the second region comprises a plurality of spaced-apart second regions.

7. The printed circuit board of claim 1, wherein the printed circuit board core has a lower face which is arranged at a distance from the upper face and, correspondingly to the upper face, has a metallization layer with a first region and a second region, wherein an electric module is arranged on the first region, and the electric module is encapsulated with a sealing material, wherein the encapsulation is bounded by the second region.

8. The printed circuit board of claim 1, wherein the printed circuit board core is multi-layered.

9. A transmission controller for a motor vehicle comprising the printed circuit board of claim 1.

* * * * *